United States Patent
Ishii

(10) Patent No.: US 9,338,374 B2
(45) Date of Patent: May 10, 2016

(54) SOLID-STATE IMAGE SENSOR, METHOD FOR DRIVING SOLID-STATE IMAGE SENSOR, AND ELECTRONIC DEVICE

(71) Applicant: Sony Corporation, Tokyo (JP)

(72) Inventor: Shunsuke Ishii, Kumamoto (JP)

(73) Assignee: SONY CORPORATION, Tokyo (JP)

( * ) Notice: Subject to any disclaimer, the term of this patent is extended or adjusted under 35 U.S.C. 154(b) by 17 days.

(21) Appl. No.: 14/230,525

(22) Filed: Mar. 31, 2014

(65) Prior Publication Data

US 2014/0333805 A1    Nov. 13, 2014

(30) Foreign Application Priority Data

May 13, 2013    (JP) .................................. 2013-100935

(51) Int. Cl.
  *H04N 5/355*    (2011.01)
  *H04N 9/04*    (2006.01)
  *H01L 27/146*    (2006.01)
  *H04N 5/3745*    (2011.01)

(52) U.S. Cl.
  CPC ........ *H04N 5/3559* (2013.01); *H01L 27/14641* (2013.01); *H04N 5/37457* (2013.01); *H04N 9/045* (2013.01)

(58) Field of Classification Search
  CPC .................................................... H04N 5/3559
  See application file for complete search history.

(56) References Cited

U.S. PATENT DOCUMENTS

| | | | |
|---|---|---|---|
| 7,800,145 B2 * | 9/2010 | Toros ................ | H01L 27/14609 257/292 |
| 8,847,136 B2 * | 9/2014 | Ayers ................ | H01L 27/14609 250/208.1 |
| 2005/0168603 A1 * | 8/2005 | Hiyama et al. ................ | 348/294 |
| 2006/0146157 A1 * | 7/2006 | Toros et al. .................... | 348/308 |
| 2009/0115878 A1 * | 5/2009 | Mauritzson .......... | H04N 3/1512 348/307 |
| 2009/0160979 A1 * | 6/2009 | Xu et al. ....................... | 348/243 |
| 2013/0020466 A1 * | 1/2013 | Ayers ................ | H01L 27/14609 250/208.1 |

FOREIGN PATENT DOCUMENTS

| | | |
|---|---|---|
| JP | 05-095008 | 4/1993 |
| JP | 05-251480 | 9/1993 |

* cited by examiner

*Primary Examiner* — Ahmed A Berhan
(74) *Attorney, Agent, or Firm* — Michael Best & Friedrich LLP

(57) ABSTRACT

Provided is a solid-state image sensor including a pixel array unit and a driving control unit. In the pixel array unit, pixels each including a charge accumulation unit accumulating a photocharge corresponding to an amount of received light, a signal conversion unit converting the photocharge into an electric signal, and a charge transfer unit performing, with a driving signal, switching between a conduction state and a non-conduction state, the charge transfer unit being disposed between the charge accumulation unit and the signal conversion unit are arranged. The driving control unit controls a state of the charge transfer unit with the driving signal and performs a first driving control in which the charge transfer unit is kept being in the conduction state from when the photocharge is transferred from the charge accumulation unit to the signal conversion unit until when a first signal corresponding to the transferred photocharge is read out.

13 Claims, 7 Drawing Sheets

EFFECTIVE PIXEL SIGNAL

SOLID-STATE IMAGE SENSOR, METHOD FOR DRIVING SOLID-STATE IMAGE SENSOR, AND ELECTRONIC DEVICE

CROSS REFERENCE TO RELATED APPLICATIONS

This application claims the benefit of Japanese Priority Patent Application JP 2013-100935 filed May 13, 2013, the entire contents of which are incorporated herein by reference.

BACKGROUND

The present technology relates to a solid-state image sensor, a method for driving the solid-state image sensor, and an electronic device, particularly to a solid-state image sensor, a method for driving the solid-state image sensor, and an electronic device that are suitably used when conversion efficiency is changed.

In the related art, it is proposed that the efficiency of conversion of charges accumulated in pixels into voltage (charge-voltage conversion efficiency) can be changed by controlling a control gate provided between a floating diffusion and an output gate in a CCD image sensor and changing the capacity of the floating diffusion (e.g., see JP H5-95008A).

In the related art, further, it is proposed that the conversion efficiency can be changed by binding a floating diffusion and a diffusion region via a precharge gate, the diffusion region and the precharge gate being provided between the floating diffusion and a precharge drain region in a CCD image sensor and changing the capacity of the floating diffusion (e.g., see JP H5-251480A).

SUMMARY

In the techniques disclosed in JP H5-095008A and JP H5-251480A, however, it is necessary to add a gate or a diffusion region additionally, thereby possibly causing the following issues: a decrease in the area of a light-receiving portion (photodiode), an increase in manufacturing steps, and an increase in manufacturing cost.

Accordingly, the present technology is made to be able to change the conversion efficiency without changing a pixel structure.

According to a first embodiment of the present technology, there is provided a solid-state image sensor including a pixel array unit in which a plurality of pixels are arranged, each of the pixels including a charge accumulation unit configured to accumulate a photocharge corresponding to an amount of received light, a signal conversion unit configured to convert the photocharge into an electric signal, and a charge transfer unit configured to be able to perform, with a predetermined driving signal, switching between a conduction state in which the photocharge is transferred from the charge accumulation unit to the signal conversion unit and a non-conduction state in which the transfer of the photocharge from the charge accumulation unit to the signal conversion unit is stopped, the charge transfer unit being disposed between the charge accumulation unit and the signal conversion unit; and a driving control unit configured to control a state of the charge transfer unit with the driving signal and to perform a first driving control in which the charge transfer unit is kept being in the conduction state from when the photocharge is transferred from the charge accumulation unit to the signal conversion unit until when a first signal corresponding to the transferred photocharge is read out.

The driving control unit may perform, by controlling a timing at which the driving signal is supplied to the charge transfer unit, switching between the first driving control and a second driving control in which the first signal is read out, after the photocharge is transferred from the charge accumulation unit to the signal conversion unit and then the charge transfer unit is set to be in the non-conduction state.

The driving control unit may perform switching between the first driving control and the second driving control in accordance with the amount of received light.

A signal processing unit configured to generate a pixel signal based on a difference between the first signal and a second signal which is read out in a state where the charge transfer unit is set to be in the non-conduction state and the signal conversion unit is reset may be further included.

At a time of the first driving control, the signal processing unit may correct the pixel signal of an effective pixel in the pixel array unit by subtracting the pixel signal of an optical black pixel in the pixel array unit from the pixel signal of the effective pixel.

At a time of the first driving control, the signal processing unit multiplies the first signal and the second signal by different gains in a manner that a signal value becomes equal with respect to a same amount of electric signals.

According to the first embodiment of the present technology, there is provided a method for driving a solid-state image sensor including performing, by a solid-state image sensor including a pixel array unit in which a plurality of pixels are arranged, each of the pixels including a charge accumulation unit configured to accumulate a photocharge corresponding to an amount of received light, a signal conversion unit configured to convert the photocharge into an electric signal, and a charge transfer unit configured to be able to perform, with a predetermined driving signal, switching between a conduction state in which the photocharge is transferred from the charge accumulation unit to the signal conversion unit and a non-conduction state in which the transfer of the photocharge from the charge accumulation unit to the signal conversion unit is stopped, the charge transfer unit being disposed between the charge accumulation unit and the signal conversion unit, a driving control in which the charge transfer unit is kept being in the conduction state from when the photocharge is transferred from the charge accumulation unit to the signal conversion unit until when a signal corresponding to the transferred photocharge is read out.

According to a second embodiment of the present technology, there is provided an electronic device including a solid-state image sensor including a pixel array unit in which a plurality of pixels are arranged, each of the pixels including a charge accumulation unit configured to accumulate a photocharge corresponding to an amount of received light, a signal conversion unit configured to convert the photocharge into an electric signal, and a charge transfer unit configured to be able to perform, with a predetermined driving signal, switching between a conduction state in which the photocharge is transferred from the charge accumulation unit to the signal conversion unit and a non-conduction state in which the transfer of the photocharge from the charge accumulation unit to the signal conversion unit is stopped, the charge transfer unit being disposed between the charge accumulation unit and the signal conversion unit, and a driving control unit configured to control a state of the charge transfer unit with the driving signal and to perform a first driving control in which the charge transfer unit is kept being in the conduction state from when the photocharge is transferred from the charge accumulation unit to the signal conversion unit until when a first signal corresponding to the transferred photocharge is read out; and a signal processing unit configured to perform signal processing on a pixel signal output from the pixel.

According to the first embodiment of the present technology, the charge transfer unit is kept in the conduction state from when the photocharge is transferred from the charge accumulation unit to the signal conversion unit until when the signal in accordance with the transferred photocharge is read out.

According to the second embodiment of the present technology, the charge transfer unit is kept in the conduction state and signal processing is performed on the pixel signal output from the pixel, from when the photocharge is transferred from the charge accumulation unit to the signal conversion unit until when the signal in accordance with the transferred photocharge is read out.

According to any of the first embodiment and the second embodiment of the present technology, it is possible to change the conversion efficiency without changing the pixel structure.

DETAILED DESCRIPTION OF THE EMBODIMENT(S)

Figure 1:
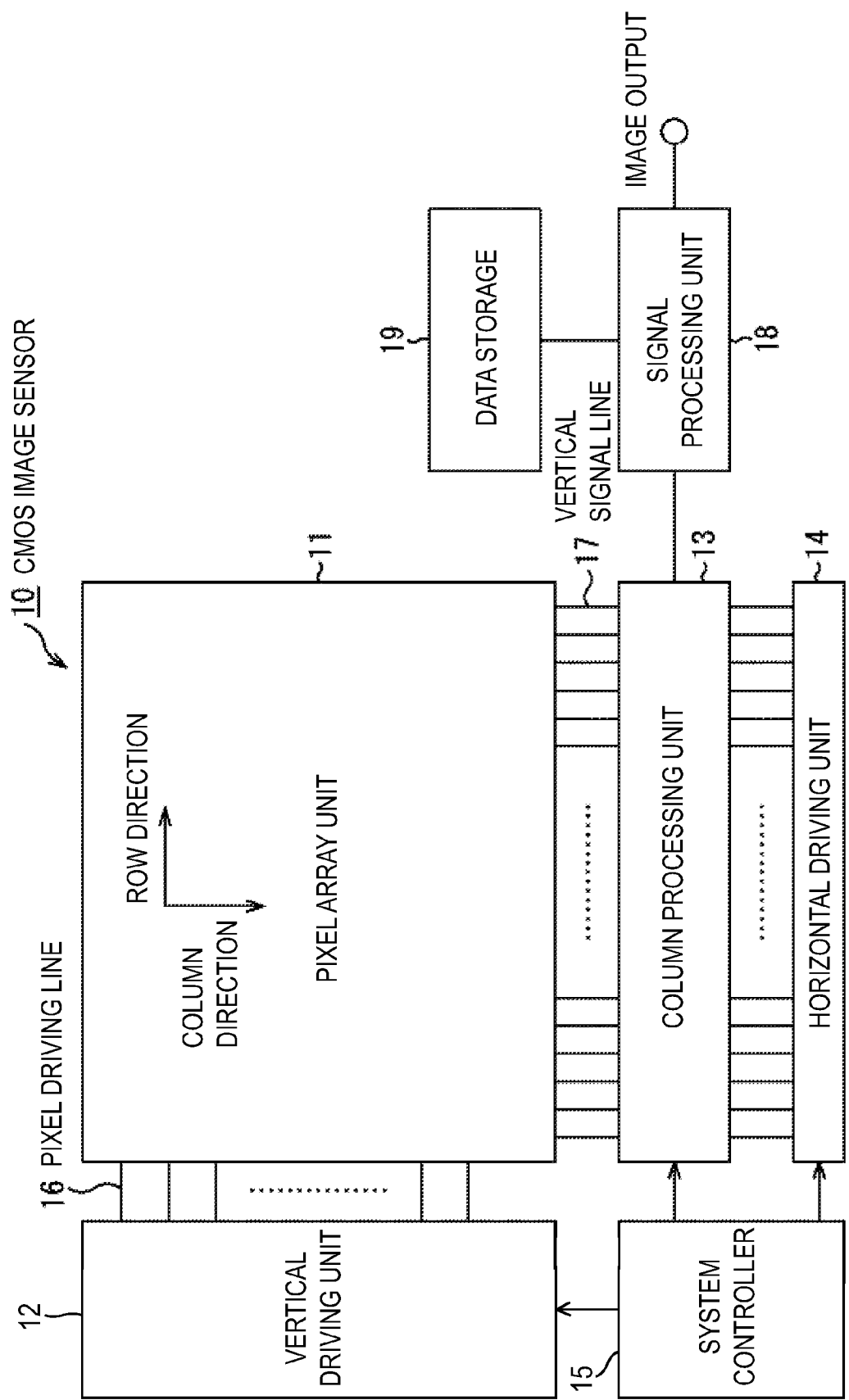
FIG. 1 is a block diagram showing an embodiment of a CMOS image sensor to which the present technology is applied.

Hereinafter, preferred embodiments of the present technology will be described in detail with reference to the appended drawings. Note that, in this specification and the appended drawings, structural elements that have substantially the same function and structure are denoted with the same reference numerals, and repeated explanation of these structural elements is omitted. Note that the description will be given in the following order.
1. Embodiments
2. Examples of Application to Camera System
3. Modification Examples 1. Embodiments 1-1. Basic System Configuration
FIG. 1 is a system configuration diagram illustrating a general configuration of a solid-state image sensor to which the present technology is applied, for example, a CMOS image sensor, which is a type of an X-Y address-type solid-state image sensor. Here, the CMOS image sensor means an image sensor formed by applying or partly using a CMOS process.

A CMOS image sensor 10 according to this embodiment includes a pixel array unit 11 formed over an unillustrated semiconductor substrate (chip) and a peripheral circuit unit integrated over the same semiconductor substrate as the pixel array unit 11. The peripheral circuit unit includes a vertical driving unit 12, a column processing unit 13, a horizontal driving unit 14, and a system controller 15, for example.

The CMOS image sensor 10 further includes a signal processing unit 18 and a data storage 19. The signal processing unit 18 and the data storage 19 may be mounted over the same substrate as the CMOS image sensor 10 or may be disposed over another substrate that is different from the substrate over which the CMOS image sensor 10 is formed. Further, each processing in the signal processing unit 18 and the data storage 19 may be processing by an external signal processing unit, such as a digital signal processor (DSP) circuit or software, provided over another substrate that is different from the substrate over which the CMOS image sensor 10 is formed.

In the pixel array unit 11, unit pixels (hereinafter, also simply referred to as "pixels") each including a photoelectric conversion unit in which photocharges in accordance with the amount of received light are generated and accumulated are two-dimensionally arranged in a row direction and a column direction, in other words, as a matrix. Here, the row direction refers to a direction in which pixels in a pixel row are arranged (i.e., the horizontal direction), and the column direction refers to a direction in which pixels in a pixel column are arranged (i.e., the vertical direction). Further, pixels arranged in the pixel array unit 11 are classified into effective pixels and optical black pixels, the effective pixels being within a region where external light is incident, the optical black pixels being disposed at the outside of the region of the effective pixels, where external light is not incident. Note that a specific circuit configuration and details of a pixel structure in the unit pixels will be described later.

In the pixel array unit 11, with respect to the pixel arrangement as the matrix, pixel driving lines 16 are wired along the row direction for each pixel row, and vertical signal lines 17 are wired along the column direction for each pixel column. Each of the pixel driving lines 16 transmits a driving signal for driving when a signal is read out from a pixel. Although FIG. 1 illustrates one wiring as the pixel driving line 16, the number of lines is not limited to one. One terminal of the pixel driving line 16 is connected to an output terminal corresponding to each row of the vertical driving unit 12.

The vertical driving unit 12 includes a shift register, an address decoder, and the like, and drives all the pixels in the pixel array unit 11 at the same time or by row unit or the like. That is, the vertical driving unit 12 forms a driving controller which drives each pixel in the pixel array unit 11, together with the system controller 15 which controls the vertical driving unit 12. Although an illustration of a specific configuration of the vertical driving unit 12 is omitted here, in general, the vertical driving unit 12 includes two scanning systems: a read scanning system and a sweep scanning system.

The read scanning system sequentially and selectively scans unit pixels in the pixel array unit 11 in a row unit to read out signals from the unit pixels. The signals read out from the unit pixels are analog signals. The sweep scanning system sweep-scans a row-to-be-read that is to be subjected to read scanning by the read scanning system to precede the read-scanning by a time for shutter speed.

The sweep scanning by the sweep scanning system sweeps unnecessary charges from photoelectric conversion units in the unit pixels in the row-to-be-read, so that the photoelectric conversion units are reset. Further, by sweeping the unnecessary charges (by resetting) by the sweep scanning system, a so-called electronic shuttering operation is performed. Here, the electronic shuttering operation refers to an operation to abandon photocharges in the photocharge conversion unit to start new light exposure (to start accumulating photocharges).

A signal read out by the reading operation by the read scanning system corresponds to the amount of light received after the preceding reading operation or the electronic shuttering operation. Further, a period from the reading timing by the preceding reading operation or the sweeping timing by the electronic shuttering operation to the reading timing by the reading operation this time is a light exposure period of photocharges in a unit pixel.

A signal output from each unit pixel in a pixel row that is selectively scanned by the vertical driving unit 12 is input to the column processing unit 13 through each of the vertical signal lines 17 for each pixel column. The column processing unit 13 performs predetermined signal processing on the signal output from each pixel in a selected row through each of the vertical signal lines 17 for each pixel column in the pixel array unit 11, and temporarily holds a pixel signal after the signal processing.

Specifically, the column processing unit 13 performs at least noise removing processing, such as correlated double sampling (CDS) processing, as the signal processing. The CDS processing by the column processing unit 13 removes a reset noise or a fixed pattern noise which is unique to a pixel, such as a variation in the threshold value of an amplifying transistor in a pixel. Instead of the noise removing processing, for example, the column processing unit 13 can have an analog-to-digital (AD) conversion function to convert an analog pixel signal to a digital signal and output the digital signal.

The horizontal driving unit 14 includes a shift register, an address decoder, and the like, and sequentially selects a unit circuit corresponding to a pixel column in the column processing unit 13. By the selective scanning by the horizontal driving unit 14, pixel signals that are subjected to the signal processing for each unit circuit in the column processing unit 13 are sequentially output.

The system controller 15 includes a timing generator that generates a variety of timing signals and the like, and controls driving of the vertical driving unit 12, the column processing unit 13, the horizontal driving unit 14, and the like, based on a variety of timings generated by the timing generator.

The signal processing unit 18 has at least an arithmetic processing function, and performs any kind of signal processing, such as an arithmetic processing, on the pixel signal output from the column processing unit 13. Further, the column processing unit 13 and the signal processing unit 18 form one signal processing unit which performs signal processing for the CMOS image sensor 10 as a whole.

The data storage 19 temporarily stores data necessary for the processing before the signal processing by the signal processing unit 18.

[Configuration Example of a Unit Pixel]

Figure 2:
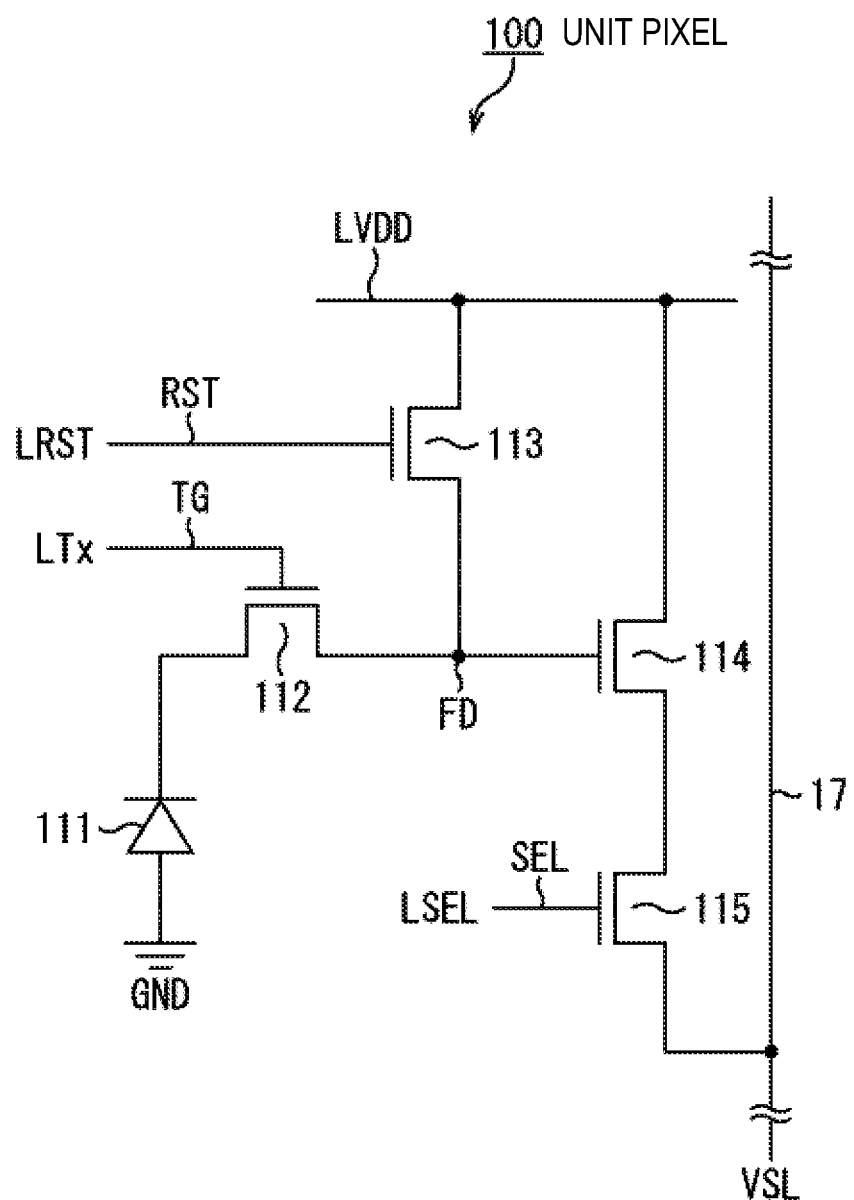
FIG. 2 is a circuit diagram showing an example of a circuit configuration of a unit pixel.

FIG. 2 shows an example of a circuit configuration of a unit pixel 100 disposed in the pixel array unit 11 in the CMOS image sensor 10 in FIG. 1.

The unit pixel 100 includes a photodiode 111, for example, as a photoelectric conversion element. Further, the unit pixel 100 includes, with respect to one photodiode 111, the following four transistors as active elements: a transfer transistor 112 as a transfer element (charge transfer unit); a reset transistor 113 as a reset element; an amplifying transistor 114; and a selection transistor 115.

The photodiode 111 performs photoelectric conversion in which incident light is converted into photocharges (here, electrons) the amount of which corresponds to the amount of received light.

The transfer transistor 112 is connected between the photodiode 111 and a floating diffusion FD which serves as an output node. The transfer transistor 112 can perform switching between a conduction state and a non-conduction state with a driving signal TG applied to a gate (transfer gate) of the transfer transistor 112 through a transfer control line LTx. The conduction state refers to a state in which electrons that are obtained by the photoelectric conversion by the photodiode 111 are transferred to the floating diffusion FD, and the non-conduction state refers to a state in which the transfer of electrons from the photodiode 111 to the floating diffusion FD is stopped.

The reset transistor 113 is connected between a power supply line LVDD and the floating diffusion FD. The reset transistor 113 can reset the potential of the floating diffusion FD to the potential of the power supply line LVDD by a reset signal RST given to a gate of the reset transistor 113 through a reset control line LRST.

The floating diffusion FD is connected to a gate of the amplifying transistor 114. The amplifying transistor 114 is connected to the vertical signal line 17 via the selection transistor 115 and forms a constant current source outside a pixel unit and a source follower.

Further, the floating diffusion FD converts electrons transferred from the photodiode 111 via the transfer transistor 112 into electric signals. That is, when a control signal (address signal or select signal) SEL is given to a gate of the selection transistor 115 through a selection control line LSEL, the selection transistor 115 is turned on. When the selection transistor 115 is turned on, the amplifying transistor 114 amplifies the potential of the floating diffusion FD and outputs a voltage that corresponds to the potential to the vertical signal line 17. The voltage output from each pixel through the vertical signal line 17 is output to the column processing unit 13.

Such operations are performed in parallel simultaneously for each pixel in one row because gates of the transfer transistor 112, the reset transistor 113, and the selection transistor 115 are connected in a row unit, for example.

The transfer control line LTx, the reset control line LRST, and the selection control line LSEL, which are wired to the unit pixel 100, are wired as one set in a row unit of pixel arrangement. The transfer transistor 112, the reset transistor 113, and the selection transistor 115 are driven by the vertical driving unit 12 serving as the pixel driving unit (FIG. 1) through the transfer control line LTx, the reset control line LRST, and the selection control line LSEL.

Figure 3:
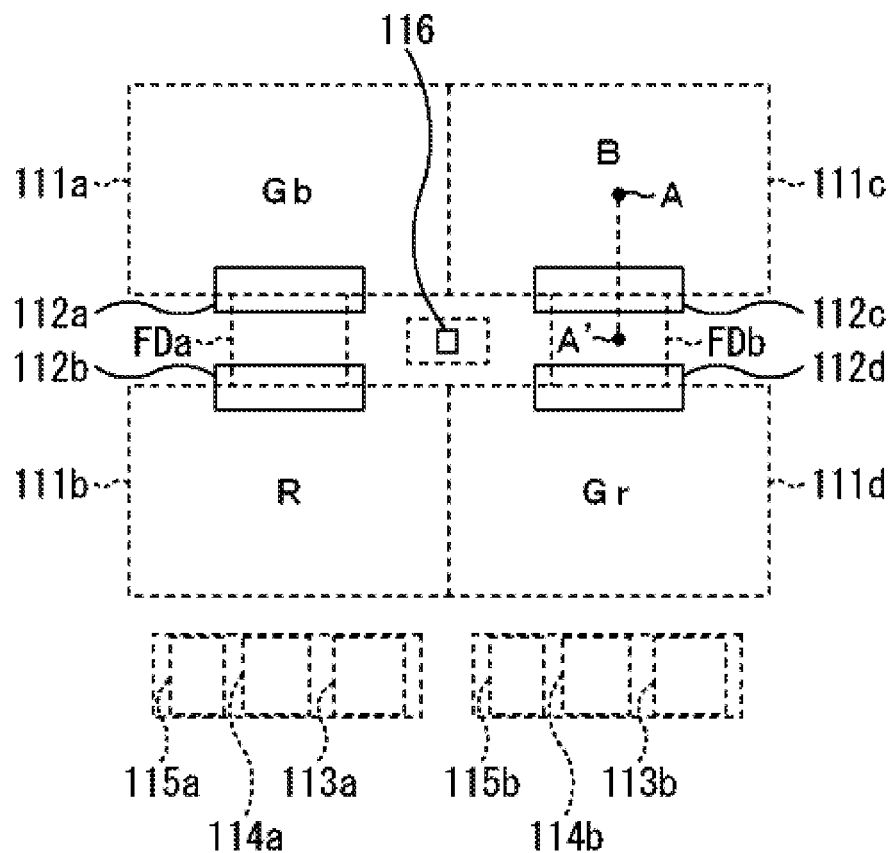
FIG. 3 is a schematic diagram showing a pixel structure of a unit pixel.

FIG. 3 is a schematic diagram showing the pixel structure of the unit pixel 100. More specifically, FIG. 3 shows a plane pattern showing a pixel layout of four pixels of the unit pixel 100. Further, units that are the same as those in FIG. 2 are denoted by the same reference numerals.

Note that FIG. 3 shows an example in which, unlike in the example of FIG. 2, the reset transistor 113, the amplifying transistor 114, the selection transistor 115, and the floating diffusion FD are shared by two photodiodes 111 in the vertical direction. In other words, in the shown example, the floating diffusion FD, the reset transistor 113, the amplifying transistor 114, and the selection transistor 115 are shared by two unit pixels that are adjacent to each other in the vertical direction.

Note that techniques of sharing pixels are not limited to this example, and a given technique can be employed. Further, the pixels are not necessarily shared.

In FIG. 3, for easy understanding, illustrations of wirings such as a power supply, a ground, and a signal line are omitted.

Photodiodes 111a to 111d are arranged in a lattice pattern. Specifically, the photodiode 111a and the photodiode 111b are arranged in the vertical direction at a predetermined interval formed by an element separation unit. Similarly, the photodiode 111c and the photodiode 111d are arranged in the vertical direction at a predetermined interval formed by an element separation unit. Further, the photodiode 111a and the photodiode 111c are arranged in the horizontal direction to be adjacent to each other. Similarly, the photodiode 111b and the photodiode 111d are arranged in the horizontal direction to be adjacent to each other.

Further, unillustrated color filters are disposed in accordance with a Bayer array with respect to the photodiodes 111. For example, a green filter is provided for the photodiode 111b and the photodiode 111d, a red filter is provided for the photodiode 111b, and a blue filter is provided for the photodiode 111c.

A floating diffusion FDa is disposed between the photodiode 111a and the photodiode 111b. Further, a transfer transistor 112a and a transfer transistor 112b are disposed between the photodiode 111a and the floating diffusion FDa (at a boundary portion), and between the photodiode 111b and the floating diffusion FDa (at a boundary portion), respectively.

A floating diffusion FDb is disposed between the photodiode 111c and the photodiode 111d. Further, a transfer transistor 112c and a transfer transistor 112d are disposed between the photodiode 111c and the floating diffusion FDb (at a boundary portion), and between the photodiode 111d and the floating diffusion FDb (at a boundary portion), respectively.

A contact portion 116 is disposed between the floating diffusion FDa and the floating diffusion FDb. The photodiodes 111a to 111d, the floating diffusions FDa and FDb, and the contact portion 116 are provided at predetermined intervals formed by element separation units. The contact portion 116 is connected to the ground, for example, and supplies a ground potential to a well region in the pixel.

On a side of the photodiode 111b, which is opposite to the side where the transfer transistor 112b is provided, a reset transistor 113a, an amplifying transistor 114a, and a selection transistor 115a are arranged in the horizontal direction at predetermined intervals formed by element separation units. Similarly, on a side of the photodiode 111d, which is opposite to the side where the transfer transistor 112d is provided, a reset transistor 113b, an amplifying transistor 114b, and a selection transistor 115b are arranged in the horizontal direction at predetermined intervals formed by element separation units.

Hereinafter, in the case where it is unnecessary to distinguish the photodiodes 111a to 111d individually, each of the photodiodes 111a to 111d is simply referred to as the photodiode 111. In the case where it is unnecessary to distinguish the transfer transistors 112a and 112b individually, each of the transfer transistors 112a and 112b is simply referred to as the transfer transistor 112. In the case where it is unnecessary to distinguish the reset transistors 113a and 113b individually, each of the reset transistors 113a and 113b is simply referred to as the reset transistor 113. In the case where it is unnecessary to distinguish the amplifying transistors 114a and 114b individually, each of the amplifying transistors 114a and 114b is simply referred to as the amplifying transistor 114. In the case where it is unnecessary to distinguish the selection transistors 115a and 115b individually, each of the selection transistors 115a and 115b is simply referred to as the selection transistor 115. In the case where it is unnecessary to distinguish the floating diffusions FDa and FDb individually, each of the floating diffusions FDa and FDb is simply referred to as the floating diffusion FD.

[Driving Method at a Time of Reading Out a Signal in the Unit Pixel 100]

Next, a driving method at a time of reading out a signal in the unit pixel 100 will be described with reference to FIGS. 4 to 7.

In the CMOS image sensor 10, by two kinds of driving methods including high conversion efficiency driving and low conversion efficiency driving, a pixel signal in the unit pixel 100 can be read out by switching the conversion efficiency.

Here, the conversion efficiency (charge-voltage conversion efficiency) means a degree of variability of potentials with respect to charges accumulated in the floating diffusion FD (in reality, a degree of variability of voltage in the vertical signal line 17, which is the output of the source follower).

Since the conversion efficiency is in inverse proportion to the capacity of the floating diffusion FD, the conversion efficiency can be controlled by controlling the capacity of the floating diffusion FD. The capacity of the floating diffusion FD includes a capacity of a diffusion layer in the floating diffusion FD (diffusion capacity), a wiring capacity between a wiring of the floating diffusion FD and another wiring, a capacity between a wiring of the floating diffusion FD and a substrate, and a capacity at a gate end or below the gate of the amplifying transistor 114. Note that in the CMOS image sensor 10, the conversion efficiency is controlled by controlling the diffusion capacity of the floating diffusion FD.

First, a driving method at a time of high conversion efficiency driving of the CMOS image sensor 10 will be described with reference to FIGS. 4 and 5. Specifically, at the time of the high conversion efficiency driving, a process in the case of transferring electrons (photocharges) accumulated in the photodiode 111c in FIG. 3 to the floating diffusion FDb to read out a pixel signal will be described.

Figure 4:
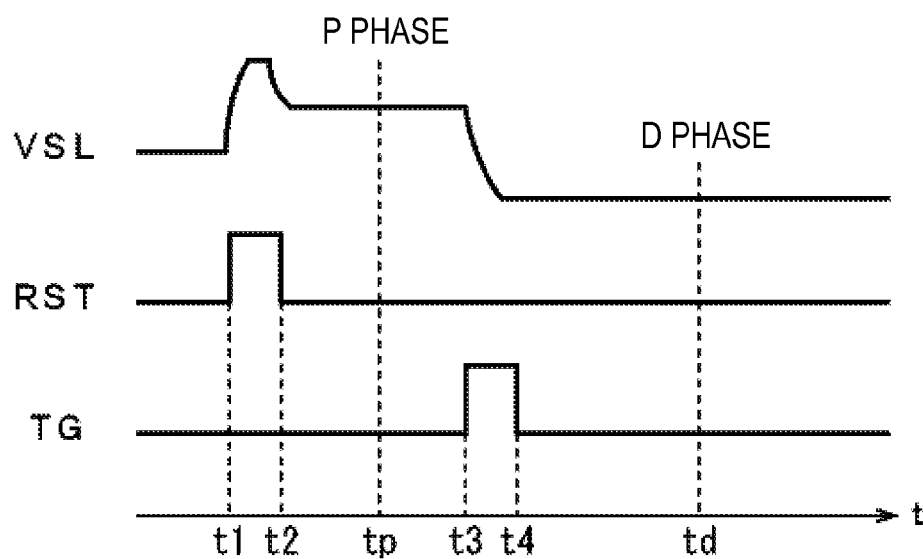
FIG. 4 is a timing chart at a time of high conversion efficiency driving.

Note that FIG. 4 shows a timing chart of a voltage VSL, the reset signal RST, and the driving signal TG in the vertical signal line 17. FIG. 5 is a one-dimensional potential diagram in the vertical direction between an A-A' portion in FIG. 3 at time td in FIG. 4. Note that the horizontal axis in FIG. 5 represents a position in the A-A' portion and the vertical axis in FIG. 5 represents a potential in the vertical direction. Further, in FIG. 5, the photodiode 111c, the transfer transistor 112c, and the floating diffusion FDb are shown by PD, TG, and FD, respectively.

Before the process in FIG. 4 starts, the control signal SEL is supplied to a gate of the selection transistor 115b (the control signal SEL is switched on), and the selection transistor 115b is turned on. That is, the amplifying transistor 114b amplifies the potential of the floating diffusion FDb and a voltage corresponding to the potential is output to the vertical signal line 17.

First, in a period from time t1 to time t2, the reset signal RST is supplied to a gate of the reset transistor 113b (the reset signal RST is switched on). Thus, the potential of the floating diffusion FDb is reset to the potential of the power supply line LVDD, and the voltage VSL becomes at a reset level.

Next, at time tp between the time t2 and time t3, the voltage VSL at the reset level (P phase) is clamped and is read out as a signal of the p phase (hereinafter referred to as a reset level signal).

Next, at the time t3, the driving signal TG is supplied to a gate of the transfer transistor 112c (the driving signal TG is set to be at a High level (switched on)), and the transfer transistor 112c is turned on. Thus, electrons accumulated in the photodiode 111c are transferred to the floating diffusion FDb via the transfer transistor 112c. Accordingly, the potential of the floating diffusion FDb is changed to a potential corresponding to the amount of the transferred electrons, and the voltage VSL corresponding to the potential is output to the vertical signal line 17.

At time t4, the supply of the driving signal TG is stopped (the driving signal TG is set to be at a Low level (switched off)), and the transfer transistor 112c is turned off to be in a non-conduction state.

Subsequently, at the time td, in the state where the transfer transistor 112c is turned off, the voltage VSL at a data level (D phase) is clamped and read out as a signal of the D phase (hereinafter referred to as a data signal).

Figure 5:
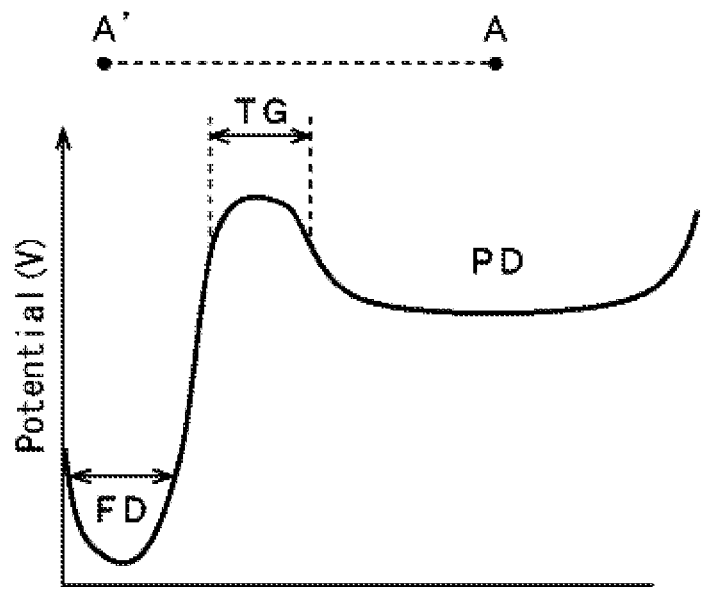
FIG. 5 is a potential diagram at a time of high conversion efficiency driving.

Here, since the transfer transistor 112c is in an off state, as shown in FIG. 5, a potential barrier is formed in a region of the transfer transistor 112c and a non-conduction state is formed between the floating diffusion FDb and the photodiode 111c.

Further, the column processing unit 13 generates a pixel signal based on a difference between the data signal and the reset level signal through a CDS process, and outputs the pixel signal to the signal processing unit 18.

Figure 6:
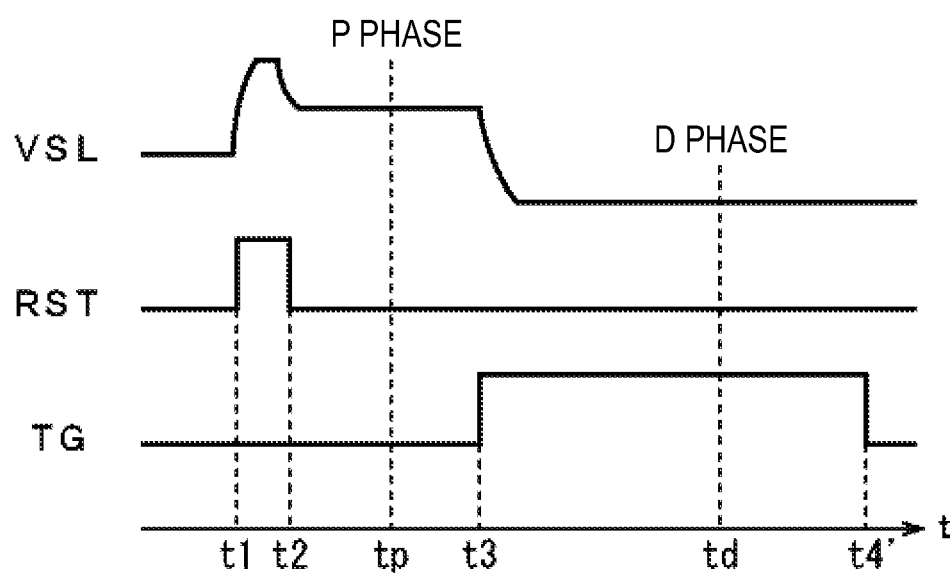
FIG. 6 is a timing chart at a time of low conversion efficiency driving.

Next, a driving method at a time of low conversion efficiency driving of the CMOS image sensor 10 will be described with reference to FIGS. 6 and 7. Note that FIG. 6 shows a timing chart that is similar to that in FIG. 4, and times corresponding to those in FIG. 4 are denoted by the same reference numerals. Further, similarly to FIG. 5, FIG. 7 shows a one-dimensional potential diagram of the A-A' portion in FIG. 3 in the vertical direction at time td in FIG. 6.

In a period from time t1 to time t3, operations similar to those at the time of the high conversion efficiency driving are performed.

Further, the supply of the driving signal TG is continued, and the transfer transistor 112c is turned on. While the conduction state is kept, the voltage VSL at the data level (D phase) is clamped at the time td and a data signal is read out.

Figure 7:
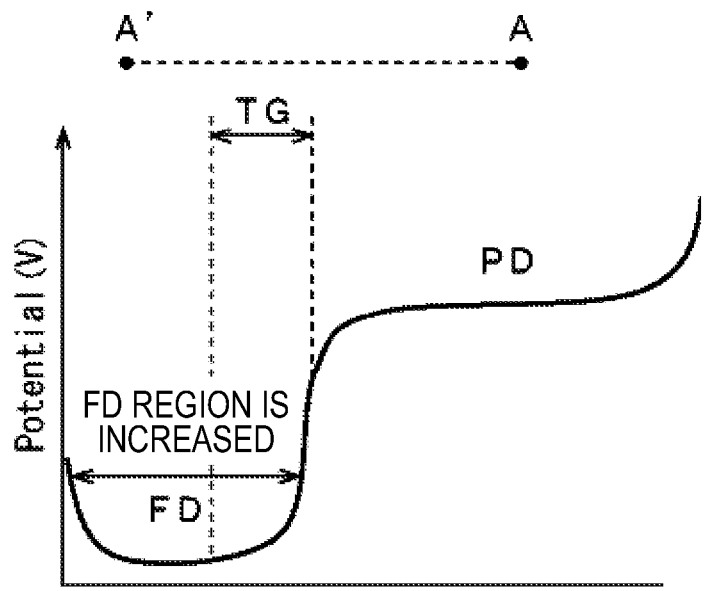
FIG. 7 is a potential diagram at a time of low conversion efficiency driving.

At this time, since the transfer transistor 112c is in the on state, as shown in FIG. 7, a conduction state is formed between the floating diffusion FDb and the photodiode 111c. Thus, a region of the floating diffusion FDb is increased to a region of the transfer transistor 112c. Therefore, compared with the time of the high conversion efficiency driving, the volume and the diffusion capacity of the floating diffusion FDb are increased. Since the diffusion capacity of the floating diffusion FDb is increased, the conversion efficiency becomes lower than in the case of the high conversion efficiency driving.

After that, at time t4', the supply of the driving signal TG is stopped (the driving signal TG is set to be at a Low level (switched off)), and the transfer transistor 112c is turned off.

The column processing unit 13 generates a pixel signal based on a difference between the data signal and the reset level signal through a CDS process and outputs the pixel signal to the signal processing unit 18.

In this manner, without changing the pixel structure of the CMOS image sensor 10, by controlling the timing at which the driving signal TG is supplied to the transfer transistor 112c, the conversion efficiency can be changed. Thus, for example, the conversion efficiency can be switched in accordance with a photographic object or photographing conditions, and photographing suitable for the photographic object or the photographing conditions is possible.

For example, first, in the case where operations are set to be normally performed with the high conversion efficiency driving, when the illuminance is high (the amount of received light is large) for example, it is possible to switch the driving to the low conversion efficiency driving and to increase a dynamic range, thereby performing high quality photographing with low ISO sensitivity. Second, in the case where operations are set to be normally performed with the low conversion efficiency driving, when the illuminance is low (the amount of received light is small) for example, by switching the driving to the high conversion efficiency driving, it is possible to increase an S/N ratio and to perform high quality photographing with high ISO sensitivity.

[Measures Against a Difference in Conversion Efficiency Between the D Phase and the P Phase]

At the time of the low conversion efficiency driving, the transfer transistor 112 is turned on to read out the data signal of the D phase, whereas the transfer transistor 112 is turned off to read out the reset level signal of the P phase. Therefore, the conversion efficiency of the P phase is higher than that of the D phase, and the following phenomenon is generated.

Figure 8:
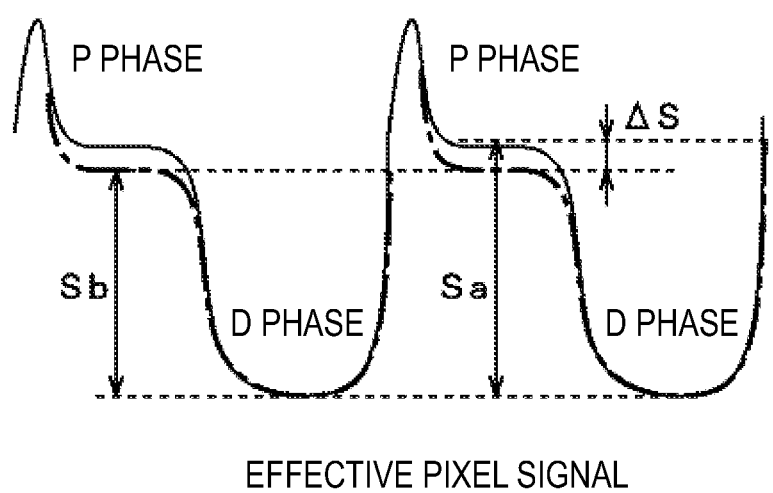
FIG. 8 is a diagram for describing a phenomenon generated by a difference in conversion efficiency between a D phase and a P phase.

FIG. 8 shows an ideal change and an actual change in the voltage VSL of the vertical signal line 17 at the time of the low conversion efficiency driving. A solid line in FIG. 8 shows the ideal change in the voltage VSL, that is, a change in the case where the conversion efficiency of the D phase is assumed to be the same as the conversion efficiency of the P phase. In contrast, a dotted line in FIG. 8 shows the actual change in the voltage VSL, that is, a change in the case where the conversion efficiency of the P phase is higher than the conversion efficiency of the D phase. Note that for easy understanding, the difference between the ideal voltage VSL and the actual voltage VSL is exaggerated in FIG. 8.

As described above, through the CDS process, the pixel signal based on the difference between the data signal and the reset signal is generated, and the value of the pixel signal here is ideally a value Sa in FIG. 8. However, since the conversion efficiency of the P phase is higher than the conversion efficiency of the D phase, the voltage of the P phase at the time of clamping becomes higher than the ideal value. Therefore, the actual value of the pixel signal becomes a value Sb in FIG. 8, and the signal value is lower than the ideal value by $\Delta S$.

Note that the low conversion efficiency driving is assumed to be used in the state where a gain is set low to photograph a bright object, for example. Therefore, the decreased value $\Delta S$ becomes an even lower value than the signal value Sb, and an image quality may be unlikely to be significantly influenced.

Further, the following two measures may be taken, for example, in order to reduce the influence of the difference in the conversion efficiency between the D phase and the P phase on the image quality.

Figure 9:
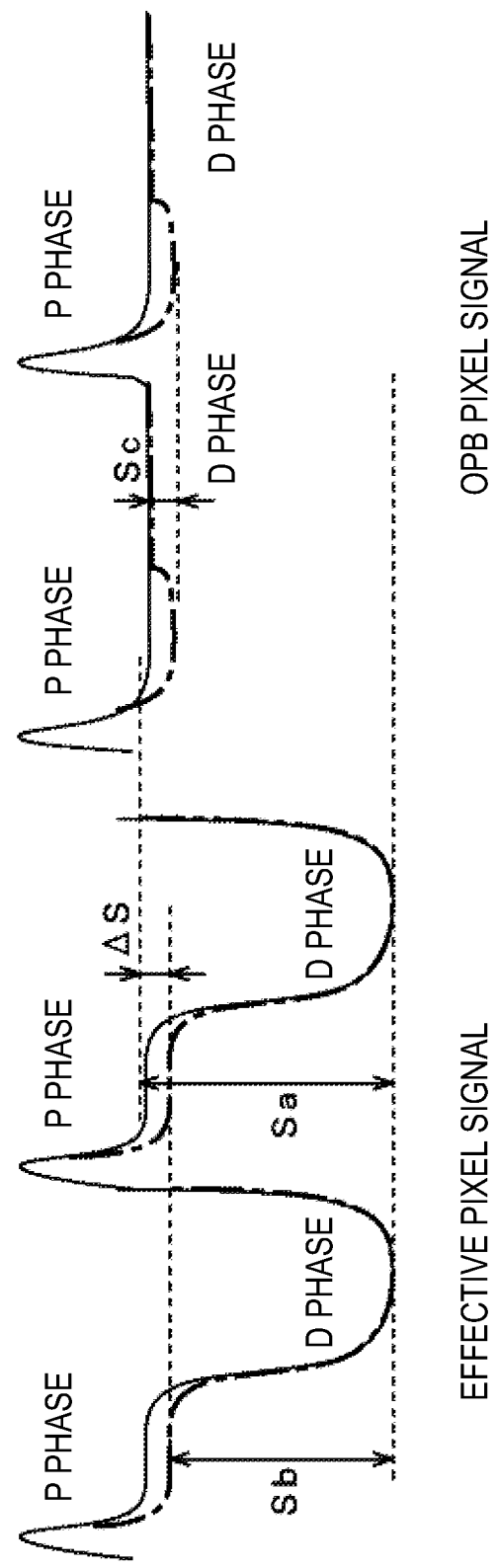
FIG. 9 is a diagram for describing a method that reduces influence of a difference in conversion efficiency between a D phase and a P phase.

A first measure is to perform black level correction by using optical black (OPB) pixels. At the time of the low conversion efficiency driving, in the OPB pixels, the conversion efficiency differs between the D phase and the P phase as in effective pixels. Accordingly, as shown in FIG. 9, the voltage VSL differs owing to the change in the conversion efficiency despite substantially the same potential of the floating diffusion FD in the D phase and the P phase. Further, a value of a pixel signal Sc obtained by subtracting the reset level signal of the P phase from the data signal of the D phase becomes a negative value, and the absolute value becomes substantially equal to the above-described decreased value ΔS of the pixel signal of effective pixels.

Accordingly, for example, in the column processing unit 13 or the signal processing unit 18, by subtracting the value of the pixel signal of the OPB pixel after the CDS process from the pixel signal of the effective pixel after the CDS process, the difference in the conversion efficiency between the D phase and the P phase can be offset and the decreased value ΔS can be corrected.

Note that a pixel signal of the effective pixel at a time of an ultrahigh speed shuttering or a pixel signal of the effective pixel in a complete light-shielded state may be used instead of the pixel signal of the OPB pixel, for example.

A second measure is to make the conversion efficiency of the D phase to be substantially equal to the conversion efficiency of the P phase at the time of conversion into a digital signal by multiplying different analog gains to the data signal of the D phase and the reset signal of the P phase in accordance with a degree of variation in the conversion efficiency. That is, the analog gain with respect to the reset level signal is made lower than the analog gain with respect to the data level signal such that the signal values become substantially equal with respect to the same amount of charge, in the data signal and the reset level signal obtained after the analog gains are multiplied.

Note that in the case where the CDS process is performed after the conversion into the digital signal, the data signal and the reset level signal after the conversion into the digital signal may be multiplied by different gains.

Alternatively, either the data signal or the reset level signal may be multiplied by a gain such that the conversion efficiency of the D phase is made substantially equal to the conversion efficiency of the P phase.

2. Examples of Application to Camera System

Figure 10:
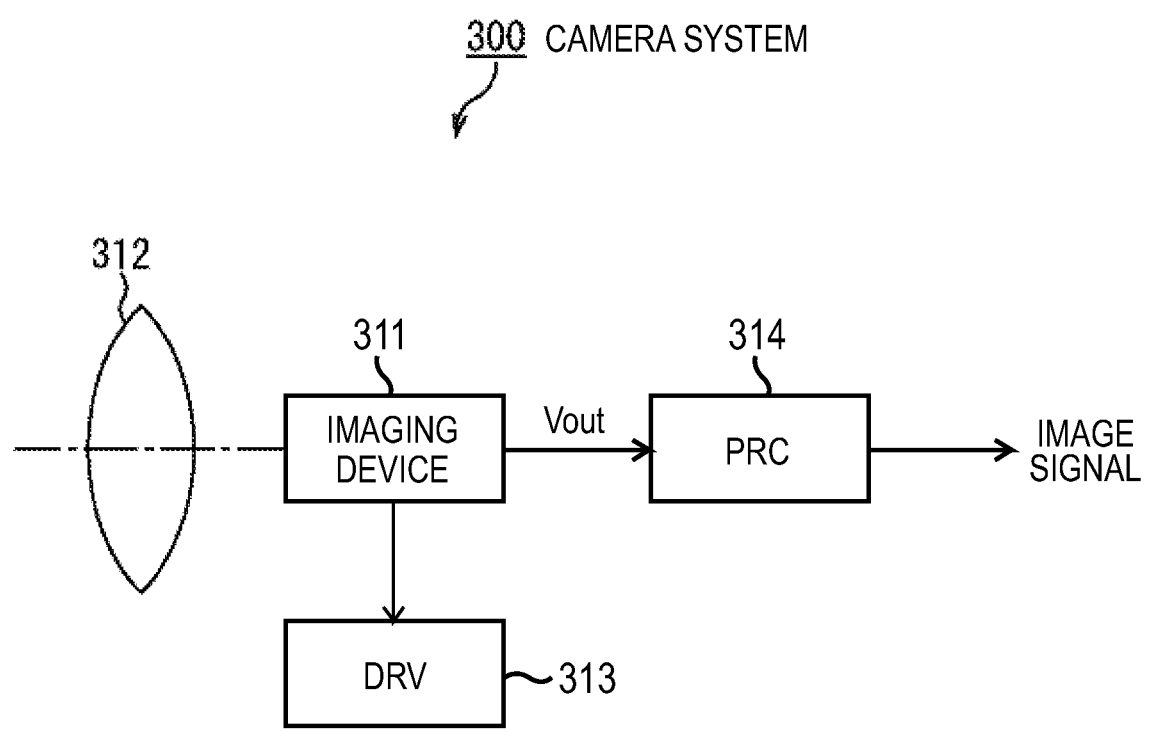
FIG. 10 is a view showing a configuration example of a camera system.

FIG. 10 shows an example of a configuration of a camera system to which the solid-state image sensor according to an embodiment of the present technology is applied.

A camera system 300 includes an imaging device 311 to which the CMOS image sensor 10 can be applied, as shown in FIG. 10.

The camera system 300 includes a lens 312 that forms an image on an imaging surface by taking in incident light (image light) for example, as an optical system that guides the incident light (forms an image of a photographic object) on a pixel region of the imaging device 311.

Further, the camera system 300 includes a driving circuit (DRV) 313 which drives the imaging device 311 and a signal processing circuit (PRC) 314 which processes an output signal of the imaging device 311.

The driving circuit 313 includes a timing generator (unillustrated) that generates various timing signals including a start pulse and a clock pulse which drive a circuit in the imaging device 311, and drives the imaging device 311 with a predetermined timing signal.

The signal processing circuit 314 performs predetermined signal processing on an output signal from the imaging device 311.

The image signal subjected to processing by the signal processing circuit 314 is recorded on a recording medium such as memory. The image information recorded on the recording medium is printed as a hard copy by a printer or the like. Further, the image signal subjected to processing by the signal processing circuit 314 is displayed on a monitor including a liquid crystal display and the like as a moving image.

As described above, by incorporating, as the imaging device 311, the above-described CMOS image sensor 10 on the imaging device such as a digital still camera, a high precision camera can be achieved.

3. Modification Examples

The present technology can be applied to a solid-state image sensor having a configuration different from the configuration in which photocharges accumulated in the above-described photodiodes are directly transferred to the floating diffusions. For example, the present technology can also be applied to a solid-state image sensor having a configuration in which a given number (1 or more) of charge accumulation units is disposed between a photodiode and a floating diffusion, and after photocharges accumulated in the photodiode are transferred to the charge accumulation units, the photocharges are transferred from the charge accumulation units to the floating diffusion via a transfer transistor. That is, in this case, by driving the transfer transistor between the charge accumulation units and the floating diffusion by any of the above-described methods, it is possible to perform switching between the high conversion efficiency driving and the low conversion efficiency driving.

The switching between the high conversion efficiency driving and the low conversion efficiency driving may be performed by setting or automatically based on the amount of received light. In the case of the automatically switching, for example, when the amount of received light is larger than a predetermined threshold, the low conversion efficiency driving is set; when the amount of receiving light is smaller than the predetermined threshold, the high conversion efficiency driving is set. Further, in the case of the automatically switching, the solid-state image sensor may perform switching based on the amount of received light detected in the inside of the solid-state image sensor or with a control signal or the like supplied based on the amount of received light detected at the outside of the solid-state image sensor.

Although the case where the present technology is applied to the CMOS image sensor has been taken as an example in the description above, the present technology is not limited to application to the CMOS image sensor. That is, the present technology can be applied to general solid-state image sensors having a configuration in which a photocharge is transferred from a charge accumulation unit to a floating diffusion via a charge transfer unit including a transfer transistor and the like, and a signal corresponding to the photocharge accumulated in the floating diffusion is read out.

Further, the present technology can be applied to a solid-state image sensor which does not perform a CDS process. The present technology can be applied to a solid-state image sensor with a scheme of taking a difference between a data signal and a reset signal, the scheme being different from CDS, such as a double data sampling (DDS) scheme.

The present technology can also be applied to a solid-state image sensor which performs only the low conversion efficiency driving, for example.

The present technology can also be applied to general solid-state image sensors which image an image of distribution of incident amounts of infrared rays, X-rays, particles, or the like, without limitation to application to the solid-state image sensor which images an image by detecting distribution of incident light amounts of visible light.

Note that the solid-state image sensor may be formed as one chip or may be in a module form having an imaging function obtained by packaging an imaging unit together with a signal processing unit or an optical system.

Further, each switch of the above-described circuits is formed by any of a variety of transistors such as a MOSFET.

It should be understood by those skilled in the art that various modifications, combinations, sub-combinations and alterations may occur depending on design requirements and other factors insofar as they are within the scope of the appended claims or the equivalents thereof.

Additionally, the present technology may also be configured as below.

(1) A solid-state image sensor including:
a pixel array unit in which a plurality of pixels are arranged, each of the pixels including
a charge accumulation unit configured to accumulate a photocharge corresponding to an amount of received light,
a signal conversion unit configured to convert the photocharge into an electric signal, and
a charge transfer unit configured to be able to perform, with a predetermined driving signal, switching between a conduction state in which the photocharge is transferred from the charge accumulation unit to the signal conversion unit and a non-conduction state in which the transfer of the photocharge from the charge accumulation unit to the signal conversion unit is stopped, the charge transfer unit being disposed between the charge accumulation unit and the signal conversion unit; and
a driving control unit configured to control a state of the charge transfer unit with the driving signal and to perform a first driving control in which the charge transfer unit is kept being in the conduction state from when the photocharge is transferred from the charge accumulation unit to the signal conversion unit until when a first signal corresponding to the transferred photocharge is read out.

(2)
The solid-state image sensor according to (1), wherein the driving control unit performs, by controlling a timing at which the driving signal is supplied to the charge transfer unit, switching between the first driving control and a second driving control in which the first signal is read out, after the photocharge is transferred from the charge accumulation unit to the signal conversion unit and then the charge transfer unit is set to be in the non-conduction state.

(3)
The solid-state image sensor according to (2), wherein the driving control unit performs switching between the first driving control and the second driving control in accordance with the amount of received light.

(4)
The solid-state image sensor according to any one of (1) to (3), further including:
a signal processing unit configured to generate a pixel signal based on a difference between the first signal and a second signal which is read out in a state where the charge transfer unit is set to be in the non-conduction state and the signal conversion unit is reset.

(5)
The solid-state image sensor according to (4), wherein, at a time of the first driving control, the signal processing unit corrects the pixel signal of an effective pixel in the pixel array unit by subtracting the pixel signal of an optical black pixel in the pixel array unit from the pixel signal of the effective pixel.

(6)
The solid-state image sensor according to (4), wherein, at a time of the first driving control, the signal processing unit multiplies the first signal and the second signal by different gains in a manner that a signal value becomes equal with respect to a same amount of photocharge.

(7)
A method for driving a solid-state image sensor including:
performing, by a solid-state image sensor including
a pixel array unit in which a plurality of pixels are arranged, each of the pixels including
a charge accumulation unit configured to accumulate a photocharge corresponding to an amount of received light,
a signal conversion unit configured to convert the photocharge into an electric signal, and
a charge transfer unit configured to be able to perform, with a predetermined driving signal, switching between a conduction state in which the photocharge is transferred from the charge accumulation unit to the signal conversion unit and a non-conduction state in which the transfer of the photocharge from the charge accumulation unit to the signal conversion unit is stopped, the charge transfer unit being disposed between the charge accumulation unit and the signal conversion unit,
a driving control in which the charge transfer unit is kept being in the conduction state from when the photocharge is transferred from the charge accumulation unit to the signal conversion unit until when a signal corresponding to the transferred photocharge is read out.

(8)
An electronic device including:
a solid-state image sensor including
a pixel array unit in which a plurality of pixels are arranged, each of the pixels including
a charge accumulation unit configured to accumulate a photocharge corresponding to an amount of received light,
a signal conversion unit configured to convert the photocharge into an electric signal, and
a charge transfer unit configured to be able to perform, with a predetermined driving signal, switching between a conduction state in which the photocharge is transferred from the charge accumulation unit to the signal conversion unit and a non-conduction state in which the transfer of the photocharge from the charge accumulation unit to the signal conversion unit is stopped, the charge transfer unit being disposed between the charge accumulation unit and the signal conversion unit, and
a driving control unit configured to control a state of the charge transfer unit with the driving signal and to perform a first driving control in which the charge transfer unit is kept being in the conduction state from when the photocharge is transferred from the charge accumulation unit to the signal conversion unit until when a first signal corresponding to the transferred photocharge is read out; and
a signal processing unit configured to perform signal processing on a pixel signal output from the pixel.

What is claimed is:
1. A solid-state image sensor comprising:
a reset transistor that is controllable to transition between a non-conduction state and a conduction state during high conversion efficiency driving and during low conversion efficiency driving, the conduction state is an electrical connection between a power supply line and a floating diffusion; and
a transfer transistor that is controllable to provide an electrical connection between a photoelectric conversion unit and the floating diffusion only during the non-con- duction state, the non-conduction state is an electrical disconnection of the floating diffusion from the power supply line, a driving unit that automatically switches a driving operation between the high conversion efficiency driving and the low conversion efficiency driving in accordance with an amount of light received by the photoelectric conversion unit;

wherein during the high conversion efficiency driving, the transfer transistor is controllable to electrically connect the photoelectric conversion unit to the floating diffusion for a first length of time and then to disconnect the photoelectric conversion unit from the floating diffusion, and wherein during the low conversion efficiency driving, the transfer transistor is controllable to electrically connect the photoelectric conversion unit to the floating diffusion for a second length of time that is longer than the first length of time and then to disconnect the photoelectric conversion unit from the floating diffusion.

2. The solid-state image sensor according to claim 1, wherein the floating diffusion is electrically connected to a gate of an amplifying transistor.

3. The solid-state image sensor according to claim 2, further comprising:
a selection transistor that is controllable to provide an electrical connection and disconnection between the amplifying transistor and a vertical signal line.

4. The solid-state image sensor according to claim 3, wherein the amplifying transistor is controllable to provide an electrical connection and disconnection between the selection transistor and the power supply line.

5. The solid-state image sensor according to claim 2, wherein in a pixel layout, the amplifying transistor is between the reset transistor and the selection transistor.

6. The solid-state image sensor according to claim 5, wherein in the pixel layout, the photoelectric conversion unit is between the amplifying transistor and the floating diffusion.

7. The solid-state image sensor according to claim 1, wherein the photoelectric conversion unit is configured to convert the light into photocharges.

8. An electronic device comprising:
the solid-state image sensor according to claim 1; and
a signal processing unit that processes a pixel signal output from a pixel.

9. A method for driving a solid-state image sensor comprising:
transitioning between a non-conduction state and a conduction state during high conversion efficiency driving, the conduction state is an electrical connection between a power supply line and a floating diffusion;
transitioning between the non-conduction state and the conduction state during low conversion efficiency driving, the non-conduction state is an electrical disconnection of the floating diffusion from the power supply line; and
providing an electrical connection between a photoelectric conversion unit and the floating diffusion only during the non-conduction state,
automatically switching a driving operation between the high conversion efficiency driving and the low conversion efficiency driving in accordance with an amount of light received by the photoelectric conversion unit;
wherein during the high conversion efficiency driving, the photoelectric conversion unit is electrically connected to the floating diffusion for a first length of time and then to disconnect the photoelectric conversion unit from the floating diffusion, and
wherein during the low conversion efficiency driving, the photoelectric conversion unit is electrically connected to the floating diffusion for a second length of time that is longer than the first length of time and then to disconnect the photoelectric conversion unit from the floating diffusion.

10. The method according to claim 9, wherein the floating diffusion is electrically connected to a gate of an amplifying transistor.

11. The method according to claim 10, further comprising:
providing an electrical connection and disconnection between the amplifying transistor and a vertical signal line.

12. The method according to claim 9, wherein the photoelectric conversion unit converts the light into photocharges.

13. The method according to claim 9, further comprising:
providing an electrical connection and disconnection between a selection transistor and the power supply line.

* * * * *